United States Patent
Yamazaki et al.

(10) Patent No.: US 7,462,011 B2
(45) Date of Patent: Dec. 9, 2008

(54) SUBSTRATE PROCESSING SYSTEM, SUBSTRATE PROCESSING METHOD, SEALED CONTAINER STORING APPARATUS, PROGRAM FOR IMPLEMENTING THE SUBSTRATE PROCESSING METHOD, AND STORAGE MEDIUM STORING THE PROGRAM

(75) Inventors: Satoshi Yamazaki, Nirasaki (JP); Tsukasa Makino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 532 days.

(21) Appl. No.: 11/202,317

(22) Filed: Aug. 12, 2005

(65) Prior Publication Data

US 2006/0105473 A1 May 18, 2006

Related U.S. Application Data

(60) Provisional application No. 60/608,368, filed on Sep. 10, 2004.

(30) Foreign Application Priority Data

Aug. 12, 2004 (JP) .............................. 2004-235266
Jun. 3, 2005 (JP) .............................. 2005-164536

(51) Int. Cl.
*H01L 21/68* (2006.01)
*H01L 21/677* (2006.01)
*B05C 3/02* (2006.01)

(52) U.S. Cl. ........................ 414/754; 118/729; 118/500; 414/940; 414/757

(58) Field of Classification Search ................. 118/500, 118/723 R, 729; 414/416.03, 416.08, 937, 414/939, 940, 754, 757
See application file for complete search history.

(56) References Cited

U.S. PATENT DOCUMENTS 5,468,112 A * 11/1995 Ishii et al. .............. 414/416.03

(Continued)

OTHER PUBLICATIONS

Sony Corp., "SMIF Clean Minienvironment Technology," www.sony.net/Products/SC-HP/cx_news/vol23/pdf/cxeye.pdf>.

*Primary Examiner*—M. Wilczewski
(74) *Attorney, Agent, or Firm*—Oblon, Spivak, McClelland, Maier & Neustadt, P.C.

(57) ABSTRACT

A substrate processing system which is capable of preventing dust from becoming attached to substrates without increasing the degree of cleanliness of a clean room to a predetermined level, and also capable of increasing the substrate processing throughput without increasing the burden on workers. a plasma processing apparatus 2 that subjects semiconductor wafers W to plasma processing in a cleaned atmosphere. A SMIF 4 has a enclosure 23 that is connected to the plasma processing apparatus 2 and has a cleaned atmosphere therein, a pod stage 26 on which a pod 3 housing semiconductor wafers W is mounted, a pod mounting portion 24 that carries out removal of semiconductor wafers W from the pod 3 and housing of semiconductor wafers W into the pod 3, and a wafer cassette transfer arm 27 that transfers semiconductor wafers W between the pod stage 26 and the plasma processing apparatus 2 via the enclosure 23. A preliminary loader 5 having a stage-shaped unprocessed pod port 28 that stores a pod 3 housing semiconductor wafers W that have not been subjected to the plasma processing, a shelf-like processed pod port 29 that stores a sealed container housing semiconductor wafers W that have been subjected to the plasma processing, and a pod moving mechanism 30 that moves the pods 3 between the stage-shaped unprocessed pod port 28 and the pod stage 26, and between the pod stage 26 and the shelf-like processed pod port 29.

4 Claims, 12 Drawing Sheets

U.S. PATENT DOCUMENTS 5,964,561 A * 10/1999 Marohl .................... 414/217
6,079,927 A *  6/2000 Muka ...................... 414/217
6,241,824 B1 *  6/2001 Brauer et al. ............ 118/730
6,742,977 B1 *  6/2004 Okayama et al. ......... 414/217
2002/0044860 A1 *  4/2002 Hayashi et al. ........ 414/416.03
2006/0156979 A1 *  7/2006 Thakur et al. ............ 118/715
2007/0142962 A1 *  6/2007 Takizawa et al. .......... 700/218

\* cited by examiner

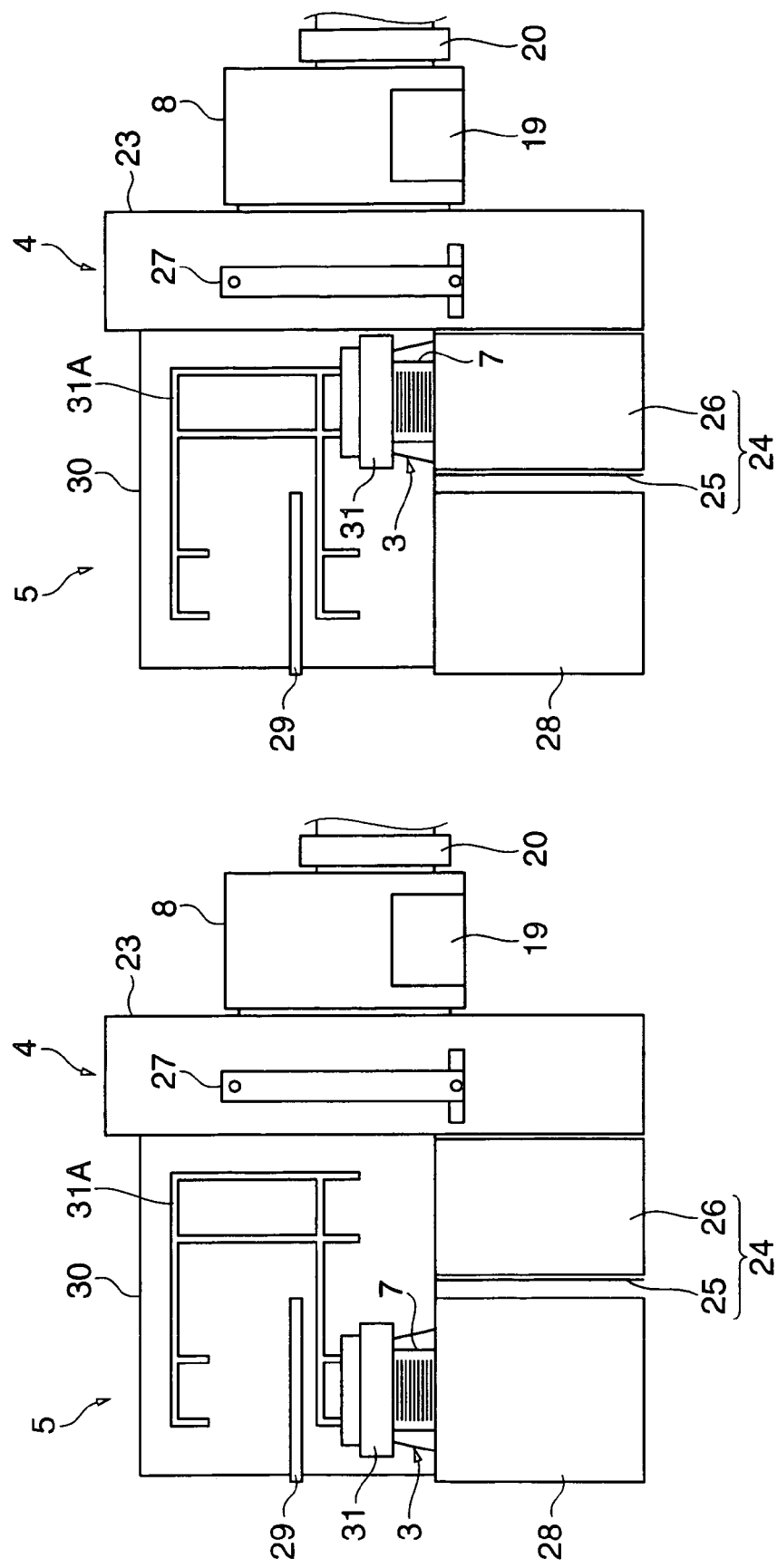

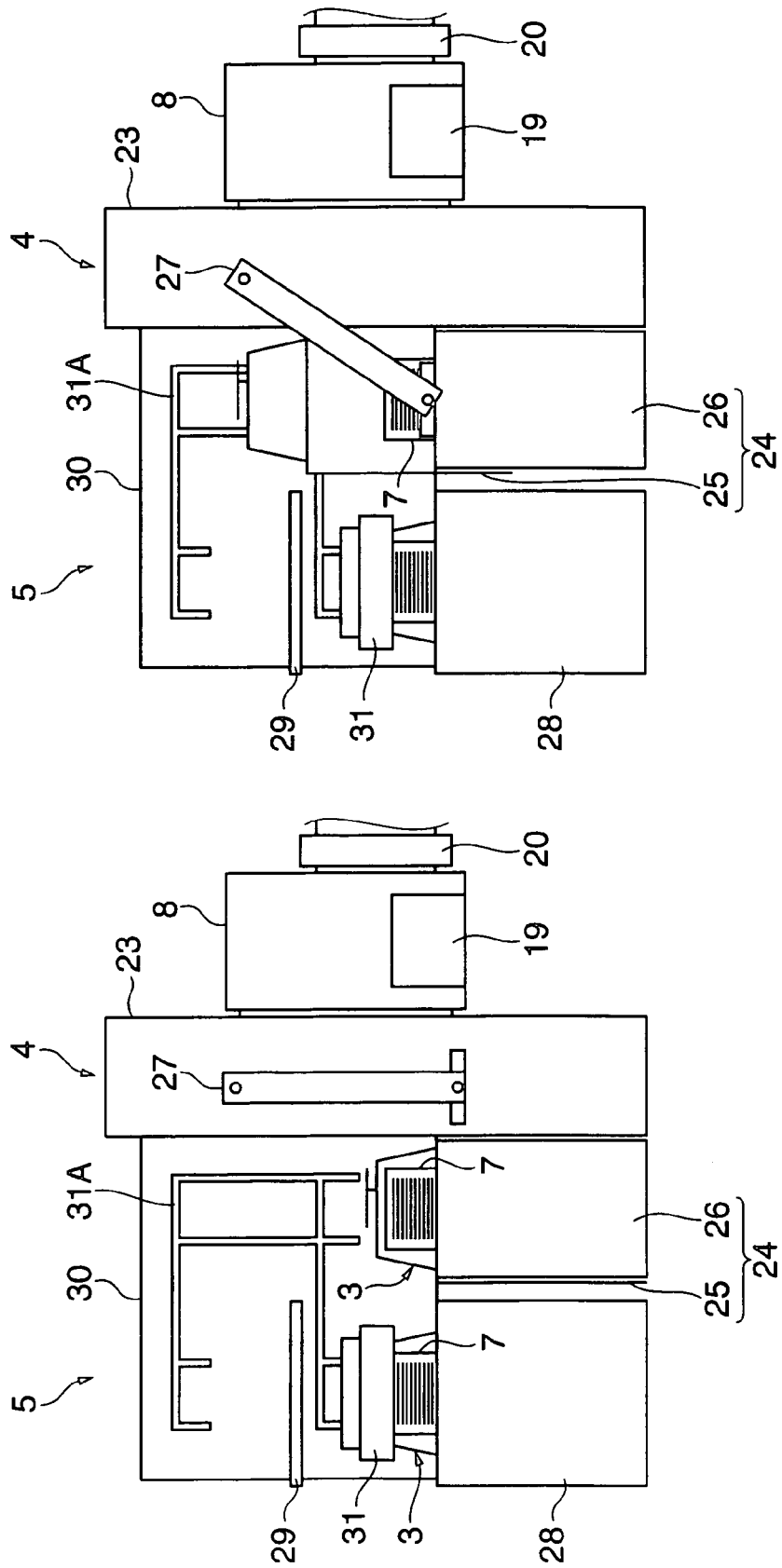

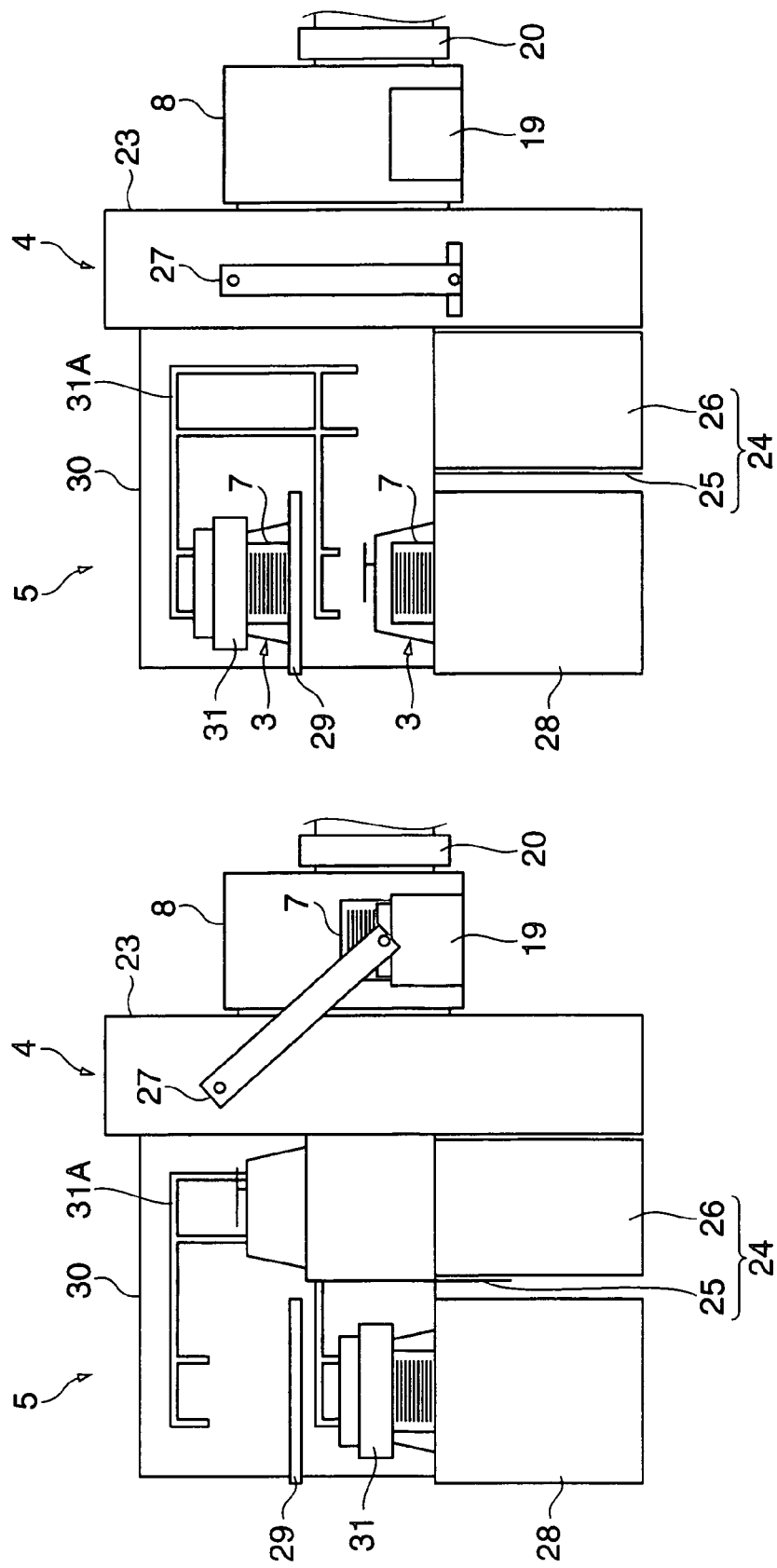

FIG. 5

| | C1 PROCESSING LOT | C1 RESERVATION LOT |
|---|---|---|
| LOT STATUS | RUNNING | WAITING |
| OPERATOR ID | operator1 | operator1 |
| RECIPE ID | system recipe 1 | system recipe 2 |
| P1 RECIPE | pc1 proc recipe 1 | pc1 proc recipe 2 |
| P2 RECIPE | pc2 proc recipe 333 | pc2 proc recipe 444 |
| P3 RECIPE | pc3 proc recipe 555 | pc3 proc recipe 666 |
| P4 RECIPE | pc4 proc recipe 777 | pc4 proc recipe 888 |
| LOT ID | lotC1 exec (0/1) | lotC1 exec (0/1) |
| TYPE | reserve data 1 | reserve data 2 |
| PROCESS NAME | reserve data p2 | reserve data p3 |

| MAIN UNIT | C1 | C2 | P1 | P2 | P3 | P4 |
|---|---|---|---|---|---|---|
| | ---- | ---- | ---- | ---- | ---- | ---- |

| END | RESERVE C1 | C1 OPTIONS | TERMINATE C1 | CANCEL C1 | SWITCH DISPLAY |
|---|---|---|---|---|---|
| END | RESERVE C2 | C2 OPTIONS | TERMINATE C2 | CANCEL C2 | SWITCH DISPLAY |

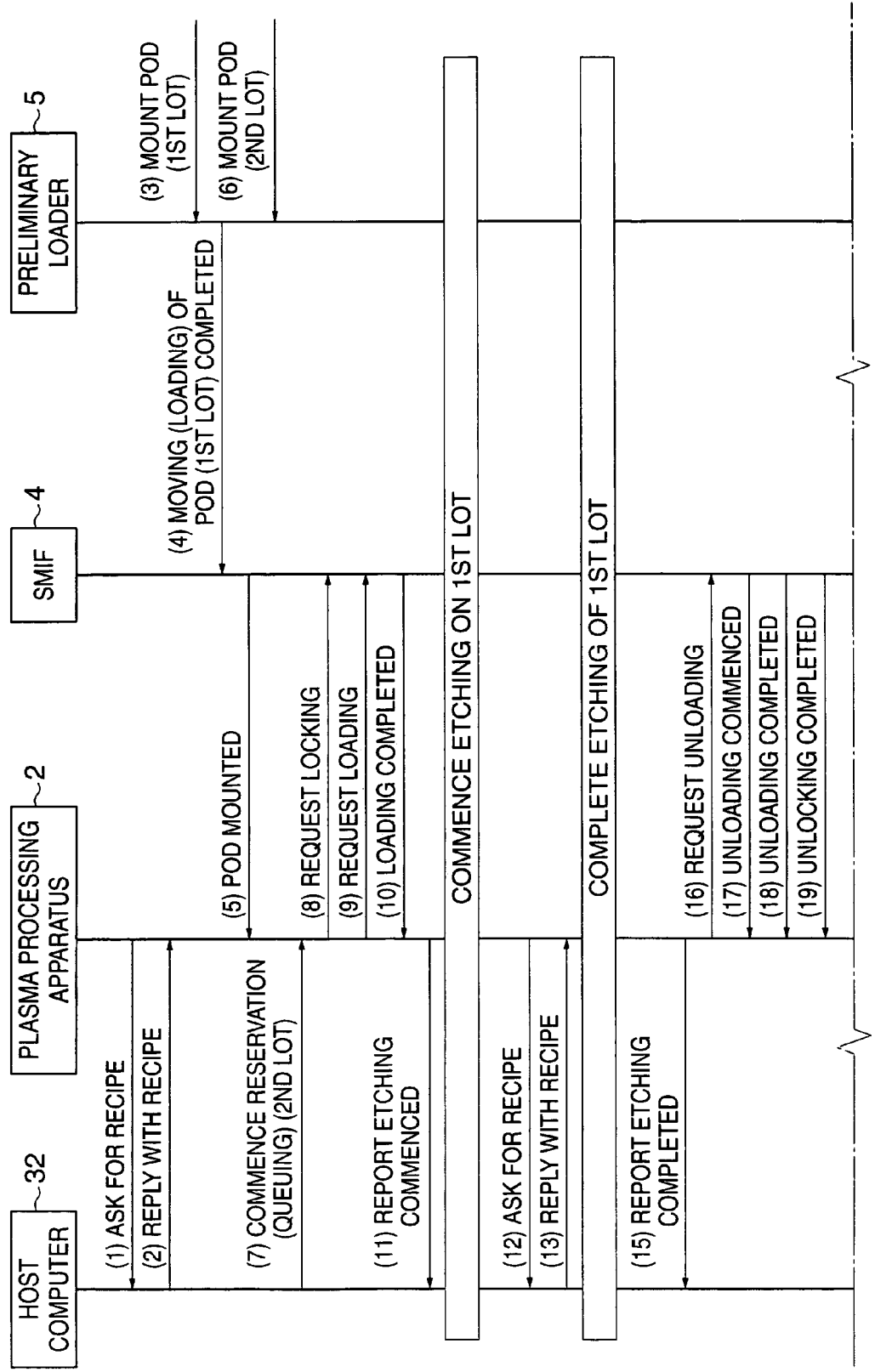

SUBSTRATE PROCESSING SYSTEM, SUBSTRATE PROCESSING METHOD, SEALED CONTAINER STORING APPARATUS, PROGRAM FOR IMPLEMENTING THE SUBSTRATE PROCESSING METHOD, AND STORAGE MEDIUM STORING THE PROGRAM

BACKGROUND OF THE INVENTION

1. Field of the Invention

The present invention relates to a substrate processing system, a substrate processing method, a sealed container storing apparatus, a program for implementing the substrate processing method, and a storage medium storing the program, and in particular relates to a substrate processing system, a substrate processing method, and a sealed container storing apparatus that use sealed containers each of which houses a predetermined number of substrates, and a program for implementing the substrate processing method, and a storage medium storing the program.

2. Description of the Related Art

When transferring substrates such as semiconductor wafers that are to be subjected to plasma processing such as film formation or etching, this transfer must be carried out in a clean atmosphere so as to prevent attachment of dust to the substrates. Hitherto, substrate processing systems have thus been placed in a room in the whole of which is maintained a clean atmosphere using an air cleaner or the like, for example a "clean room".

However, in recent years, there have been rapid advances in making the circuitry on semiconductor wafers finer, and hence there has been a rapid increase in the degree of cleanliness required of clean rooms. For example, such refinement of circuitry has reached a level that the size of the dust that must be removed is down to approximately 0.1 μm. However, with a conventional clean room, increasing the degree of cleanliness to this required level has been difficult from the viewpoints of limits on the air cleaner performance and cost.

There have thus come to be used substrate processing systems according to which, when transferring substrates, a pod that houses a predetermined number of, for example 25, substrates and isolates the housed substrates from the surrounding atmosphere is used, and when the substrates are to be subjected to plasma processing, the substrates are removed from the pod and transferred into a plasma processing apparatus, while dust is prevented from getting into the plasma processing apparatus. According to such a substrate processing system, dust of size approximately 0.1 μm can be prevented from becoming attached to the substrates without increasing the degree of cleanliness of the clean room to the required level described above.

A SMIF (standard mechanical interface) is used as an apparatus for removing the substrates from each pod in such a substrate processing system. As shown in FIG. 9A, such a SMIF 70 is comprised of an enclosure 72 which is a box-shaped sealed station unit that is disposed in front of a cassette chamber (hereinafter referred to as "C/C") 71 of a plasma processing apparatus (not shown) and communicates with the C/C 71, a pod mounting portion 73 disposed in front of the enclosure 72, and a fan filter unit (not shown) that keeps the atmosphere in the enclosure 72 clean (see "CX-PAL Issue 47", Sony Corporation, viewed online on Jul. 22, 2004, at URL http://www.sony.co.jp/Products/SC-HP/cx_pal/vol47/pdf/cxeye.pdf).

The pod mounting portion 73 has an upturned-open-box-shaped sliding cover 74 that slides upward as viewed in FIG. 9A, and a pod stage 76 on which a pod 75 is mounted. The enclosure 72 has therein a transfer arm 78 for transferring a substrate cassette 77, described below, between the pod mounting portion 73 and the C/C 71.

According to the SMIF 70, as shown in FIGS. 9B and 9C, when removing substrates from the pod 75, the sliding cover 74 is slid upward so as to lift up a pod cover 79, so that the substrate cassette 77 is separated away from the pod 75. At this time, a space formed between the sliding cover 74 and the pod stage 76 in which the substrate cassette 77 is kept is communicated with the inside of the enclosure 72 via a sliding door (not shown) disposed in front of the enclosure 72, and is thus made clean by the fan filter unit. After that, the transfer arm 78 transfers the substrate cassette 77 on the pod stage 76 into the C/C 71. Moreover, after the substrates have been subjected to the plasma processing and have been housed back in the substrate cassette 77, the substrate cassette 77 is housed back in the pod 75 and then the pod 75 is mounted back on the pod stage 76 by carrying out the reverse procedure to that described above.

However, according to the above substrate processing system, a worker must manually swap a pod 75 mounted on the pod stage 76 housing substrates that have been subjected to the plasma processing (hereinafter referred to as a "processed pod") with a pod 75 housing unprocessed substrates (hereinafter referred to as an "unprocessed pod").

In particular, to improve the substrate processing throughput, the processed pod 75 and the unprocessed pod 75 must be swapped over quickly, and hence while the substrate processing system is subjecting substrates to the plasma processing, the worker must wait by the SMIF 70 with the unprocessed pod 75 in hand. However, in recent years, the size of substrates has increased, and hence the weight of a pod 75 has increased, and thus there has been a problem that the burden on workers has increased.

On the other hand, a system may be adopted in which, to avoid such an increase in the burden on workers, the worker does not wait by the SMIF 70. In this case, after a processed pod 75 has been mounted on the pod stage 76, the worker takes out an unprocessed pod 75 from a stocker (not shown) in which a plurality of unprocessed pods 75 are housed, and swaps this unprocessed pod 75 with the processed pod 75. However, in this case, there is a problem that the substrate processing throughput markedly decreases.

SUMMARY OF THE INVENTION

It is an object of the present invention to provide a substrate processing system, a substrate processing method, a sealed container storing apparatus, a program for implementing the substrate processing method, and a storage medium storing the program, which are capable of preventing dust from becoming attached to substrates without increasing the degree of cleanliness of a clean room to a predetermined level, and also capable of increasing the substrate processing throughput without increasing the burden on workers.

To attain the above object, in a first aspect of the present invention, there is provided a substrate processing system comprising a substrate processing apparatus that subjects substrates to plasma processing in a cleaned atmosphere, a substrate transferring in/out apparatus having a sealed station unit that is connected to the substrate processing apparatus and has a cleaned atmosphere therein, a mounting stage on which a sealed container housing substrates is mounted, a substrate removal/housing apparatus that carries out removal of substrates from the sealed container and housing of substrates into the sealed container, and a substrate transferring apparatus that transfers substrates between the mounting stage and the substrate processing apparatus via the sealed station unit, and a sealed container storing apparatus having a first sealed container storage portion that stores a sealed container housing substrates that have not been subjected to the plasma processing, a second sealed container storage portion that stores a sealed container housing substrates that have been subjected to the plasma processing, and a sealed container moving apparatus that moves the sealed containers between the first sealed container storage portion and the mounting stage, and between the mounting stage and the second sealed container storage portion.

Preferably, the substrate processing system further comprises a processing contents setting apparatus that is connected to the substrate processing apparatus, for setting processing contents for the plasma processing, and a controller that is connected to the substrate processing apparatus, for controlling operation of the substrate processing apparatus based on the processing contents set by the processing contents setting apparatus, and for controlling operations of the substrate transferring in/out apparatus and the sealed container storing apparatus through communication via the substrate processing apparatus.

More preferably, the sealed container storing apparatus and the substrate transferring in/out apparatus are communicably connected together, the substrate transferring in/out apparatus and the substrate processing apparatus are communicably connected together, and the controller is in responsive to the sealed container storing apparatus informing the substrate processing apparatus via the substrate transferring in/out apparatus that a sealed container has been moved from the first sealed container storage portion onto the mounting stage, for causing the substrate processing apparatus to enable setting of processing contents for plasma processing to be carried out on substrates housed in another sealed container using the processing contents setting apparatus.

According to the construction of the first aspect described above, substrates are housed in a sealed container. After the substrates have been removed from a sealed container mounted on the mounting stage of the substrate transferring in/out apparatus, the substrates are transferred into a cleaned atmosphere and subjected to plasma processing. Furthermore, the substrate processing system has a sealed container storing apparatus having a first sealed container storage portion that stores a sealed container housing substrates that have not been subjected to the plasma processing, a second sealed container storage portion that stores a sealed container housing substrates that have been subjected to the plasma processing, and a sealed container moving apparatus that moves the sealed containers between the first sealed container storage portion and the mounting stage, and between the mounting stage and the second sealed container storage portion. As a result, while the substrates removed from the sealed container mounted on the mounting stage of the substrate transferring in/out apparatus are being subjected to the plasma processing, a worker can store a sealed container housing substrates that have not been subjected to the plasma processing on the first sealed container storage portion. After the substrates removed from the sealed container mounted on the mounting stage have been subjected to the plasma processing and have been housed back in the sealed container mounted on the mounting stage, the sealed container can then be removed from the mounting stage and stored on the second sealed container storage portion. The worker can then recover the sealed container stored on the second sealed container storage portion. Consequently, dust can be prevented from becoming attached to the substrates without increasing the degree of cleanliness of a clean room in which the substrate processing system is placed to a predetermined level, and the substrate processing throughput can be increased without increasing the burden on the worker.

Moreover, preferably, a controller controls operations of the substrate processing apparatus based on set processing contents, and controls operations of the substrate transferring in/out apparatus and the sealed container storing apparatus through communication via the substrate processing apparatus. As a result, overall control of the operations of the substrate processing system can be carried out without providing communication equipment or another controller.

Moreover, more preferably, the sealed container storing apparatus and the substrate transferring in/out apparatus are communicably connected together, the substrate transferring in/out apparatus and the substrate processing apparatus are communicably connected together, and in response to the sealed container storing apparatus informing the substrate processing apparatus via the substrate transferring in/out apparatus that a sealed container has been moved from the first sealed container storage portion onto the mounting stage, the controller causes the substrate processing apparatus to enable setting of processing contents for plasma processing to be carried out on substrates housed in another sealed container using a processing contents setting apparatus. As a result, while the substrates removed from the sealed container mounted on the mounting stage is being subjected to the plasma processing, processing contents for plasma processing to be carried out on substrates housed in another sealed container can be set.

To attain the above object, in a second aspect of the present invention, there is provided a substrate processing method comprising, a substrate removal step of carrying out removal of substrates from a sealed container that houses substrates and is mounted on a mounting stage, a first substrate transferring step of transferring substrates into a substrate processing apparatus via a sealed station unit having a cleaned atmosphere therein, a substrate processing step of subjecting substrates that have been transferred into the substrate processing apparatus to plasma processing in a cleaned atmosphere, a first sealed container storage step of storing a sealed container housing substrates that have not been subjected to the plasma processing, a second substrate transferring step of transferring substrates out of the substrate processing apparatus via the sealed station unit, a substrate housing step of carrying out housing of the substrates that have been transferred out of the substrate processing apparatus into the sealed container, a second sealed container storage step of removing from the mounting stage and storing a sealed container housing substrates that have been subjected to the plasma processing, and a sealed container moving step of moving the stored sealed container housing the substrates that have not been subjected to the plasma processing onto the mounting stage.

According to the construction of the second aspect described above, substrates are housed in a sealed container. After the substrates have been removed from a sealed container mounted on a mounting stage, the substrates are transferred into a cleaned atmosphere and subjected to plasma processing. Furthermore, a sealed container housing substrates that have not been subjected to the plasma processing is stored, a sealed container substrates that have been subjected to the plasma processing is removed from the mounting stage and stored, and then the stored sealed container housing the substrates that have not been subjected to the plasma processing is moved onto the mounting stage. As a result, while the substrates removed from the sealed container mounted on the mounting stage are being subjected to the plasma processing, a worker can store a sealed container housing substrates that have not been subjected to the plasma processing. After the substrates removed from the sealed container mounted on the mounting stage have been subjected to the plasma processing and have been housed back in the sealed container mounted on the mounting stage, the sealed container is removed from the mounting stage and stored. The worker can then recover the stored sealed container. Consequently, dust can be prevented from becoming attached to the substrates without increasing the degree of cleanliness of a clean room in which the substrate processing system is placed to a predetermined level, and the substrate processing throughput can be increased without increasing the burden on the worker.

To attain the above object, in a third aspect of the present invention, there is provided a sealed container storing apparatus for a substrate processing system that comprises a substrate processing apparatus that subjects substrates to plasma processing in a cleaned atmosphere, and a substrate transferring in/out apparatus having a sealed station unit that is connected to the substrate processing apparatus and has a cleaned atmosphere therein, a mounting stage on which a sealed container housing substrates is mounted, a substrate removal/housing apparatus that carries out removal of substrates from the sealed container and housing of substrates into the sealed container, and a substrate transferring apparatus that transfers substrates between the mounting stage and the substrate processing apparatus via the sealed station unit, the sealed container storing apparatus being connected to the substrate transferring in/out apparatus, the sealed container storing apparatus comprising, a first sealed container storage portion that stores a sealed container housing substrates that have not been subjected to the plasma processing, a second sealed container storage portion that stores a sealed container housing substrates that have been subjected to the plasma processing, and a sealed container moving apparatus that moves the sealed containers between the first sealed container storage portion and the mounting stage, and between the mounting stage and the second sealed container storage portion.

According to the construction of the third aspect described above, substrates are housed in a sealed container. After the substrates have been removed from a sealed container mounted on a mounting stage of a substrate transferring in/out apparatus, the substrates are transferred into a cleaned atmosphere and subjected to plasma processing. Furthermore, the sealed container storing apparatus has a first sealed container storage portion that stores a sealed container housing substrates that have not been subjected to the plasma processing, a second sealed container storage portion that stores a sealed container housing substrates that have been subjected to the plasma processing, and a sealed container moving apparatus that moves the sealed containers between the first sealed container storage portion and the mounting stage, and between the mounting stage and the second sealed container storage portion. As a result, while the substrates removed from the sealed container mounted on the mounting stage of the substrate transferring in/out apparatus are being subjected to the plasma processing, a worker can store a sealed container housing substrates that have not been subjected to the plasma processing on the first sealed container storage portion. After the substrates removed from the sealed container mounted on the mounting stage have been subjected to the plasma processing and have been housed back in the sealed container mounted on the mounting stage, the sealed container can then be removed from the mounting stage and stored on the second sealed container storage portion. The worker can then recover the sealed container stored on the second sealed container storage portion. Consequently, dust can be prevented from becoming attached to the substrates without increasing the degree of cleanliness of a clean room in which the substrate processing system is placed to a predetermined level, and the substrate processing throughput can be increased without increasing the burden on the worker.

To attain the above object, in a fourth aspect of the present invention, there is provided a program for causing a computer to implement a substrate processing method, the program comprising, a substrate removal module for carrying out removal of substrates from a sealed container that houses substrates and is mounted on a mounting stage, a first substrate transferring module for transferring substrates into a substrate processing apparatus via a sealed station unit having a cleaned atmosphere therein, a substrate processing module for subjecting substrates that have been transferred into the substrate processing apparatus to plasma processing in a cleaned atmosphere, a first sealed container storage module for storing a sealed container housing substrates that have not been subjected to the plasma processing, a second substrate transferring module for transferring substrates out of the substrate processing apparatus via the sealed station unit, a substrate housing module for carrying out housing of the substrates that have been transferred out of the substrate processing apparatus into the sealed container, a second sealed container storage module for removing from the mounting stage and storing a sealed container housing substrates that have been subjected to the plasma processing, and a sealed container moving module for moving the stored sealed container housing the substrates that have not been subjected to the plasma processing onto the mounting stage.

To attain the above object, in a fifth aspect of the present invention, there is provided a computer-readable storage medium storing a program for causing a computer to implement a substrate processing method, the program comprising, a substrate removal module for carrying out removal of substrates from a sealed container that houses substrates and is mounted on a mounting stage, a first substrate transferring module for transferring substrates into a substrate processing apparatus via a sealed station unit having a cleaned atmosphere therein, a substrate processing module for subjecting substrates that have been transferred into the substrate processing apparatus to plasma processing in a cleaned atmosphere, a first sealed container storage module for storing a sealed container housing substrates that have not been subjected to the plasma processing, a second substrate transferring module for transferring substrates out of the substrate processing apparatus via the sealed station unit, a substrate housing module for carrying out housing of the substrates that have been transferred out of the substrate processing apparatus into the sealed container, a second sealed container storage module for removing from the mounting stage and storing a sealed container housing substrates that have been subjected to the plasma processing, and a sealed container moving module for moving the stored sealed container housing the substrates that have not been subjected to the plasma processing onto the mounting stage.

The above and other objects, features, and advantages of the invention will become more apparent from the following detailed description taken in conjunction with the accompanying drawings.

BRIEF DESCRIPTION OF THE DRAWINGS

FIGS. 2A to 2F are views useful in explaining a plasma processing method which is a substrate processing method according to the above embodiment; specifically:

FIG. 2A shows the plasma processing system after an unprocessed pod has been mounted on an unprocessed pod port;

FIG. 2B shows the plasma processing system after the mounted pod has been moved onto a pod stage;

FIG. 2C shows the plasma processing system after another unprocessed pod has been mounted on the unprocessed pod port;

FIG. 2D shows the plasma processing system after the first-mentioned unprocessed pod has been separated into a pod cover and a base thereof;

FIG. 2E shows the plasma processing system after a wafer cassette has been transferred onto a receiving stage in a C/C; and FIG. 2F shows the plasma processing system after a processed pod has been removed from the pod stage and moved onto a processed pod port;

FIG. 5 is a view showing a recipe input GUI of a recipe setting apparatus appearing in FIG. 3;

FIGS. 6A and 6B are diagrams showing an operation and communication sequence for the plasma processing system;

FIG. 9A shows the substrate processing system after a pod has been mounted on the SMIF;

FIG. 9B shows the substrate processing system when a substrate cassette is being separated away from the pod; and FIG. 9C shows the substrate processing system after the substrate cassette has been transferred into a cassette chamber.

DETAILED DESCRIPTION OF THE PREFERRED EMBODIMENTS

The present invention will now be described in detail with reference to the drawings showing preferred embodiments thereof.

First, a substrate processing system and a sealed container storing apparatus according to an embodiment of the present invention will be described.

Figure 1:
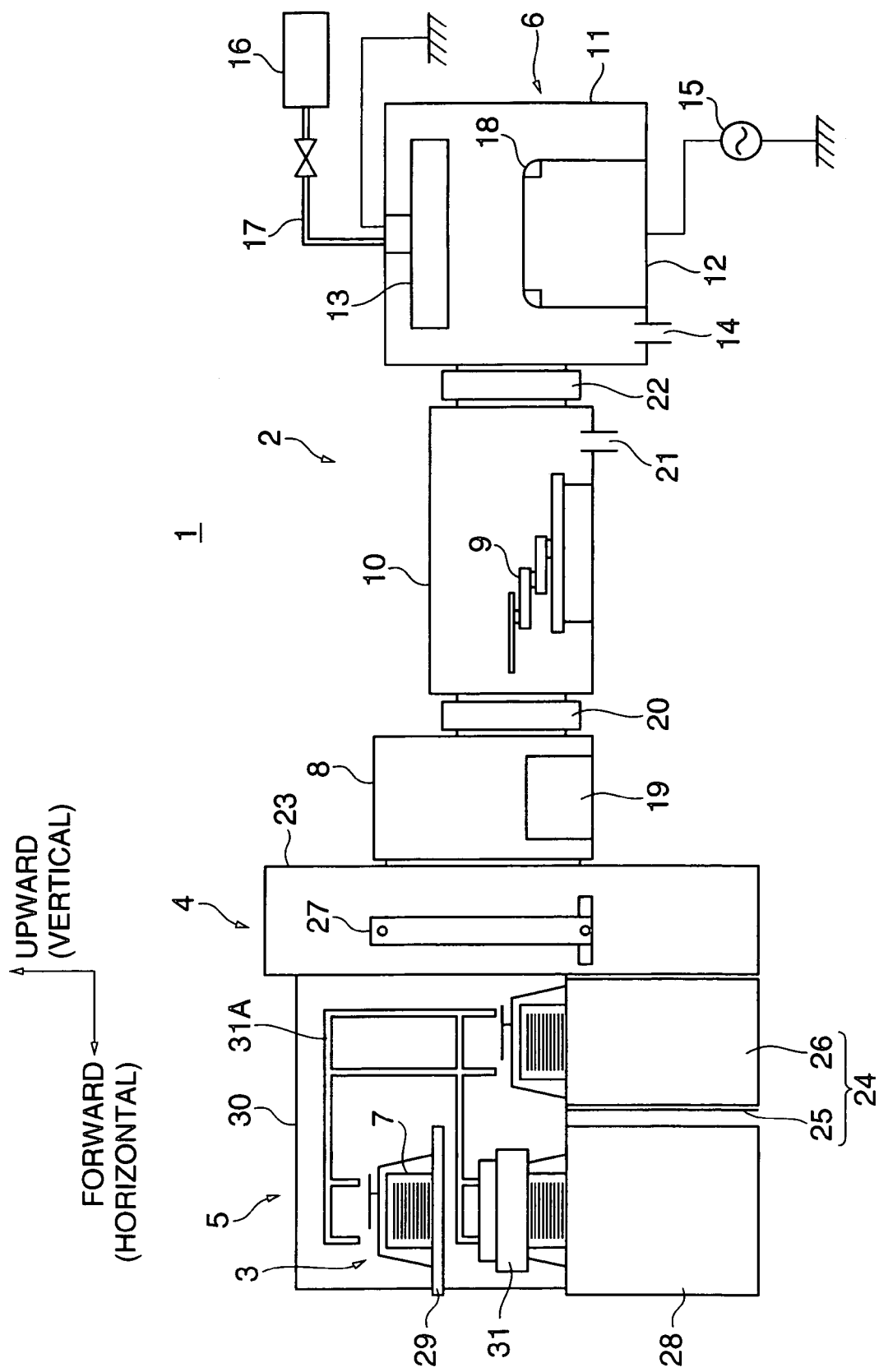
FIG. 1 is a view schematically showing the construction of a plasma processing system which is a substrate processing system according to an embodiment of the present invention.

FIG. 1 is a view schematically showing the construction of a plasma processing system which is the substrate processing system according to the present embodiment.

As shown in FIG. 1, the plasma processing system 1 is comprised of a plasma processing apparatus (substrate processing apparatus) 2 that subjects semiconductor wafers W as substrates to plasma processing such as etching, at least one SMIF (substrate transferring in/out apparatus) 4 that is disposed adjacent to the plasma processing apparatus 2, and removes semiconductor wafers W that have not been subjected to the etching (hereinafter referred to as "unprocessed semiconductor wafers") from pods 3, described below, and houses semiconductor wafers W that have been subjected to the etching (hereinafter referred to as "processed semiconductor wafers") in such pods 3, and at least one preliminary loader (sealed container storing apparatus) 5 that is disposed adjacent to the SMIF 4, and supplies pods (sealed containers) 3 housing unprocessed semiconductor wafers W (hereinafter referred to as "unprocessed pods") to the SMIF 4, and recovers pods 3 housing processed semiconductor wafers W (hereinafter referred to as "processed pods") from the SMIF 4. Each pod 3 is a substantially box-shaped sealed container, is constructed such that an upturned-open-box-shaped pod cover thereof and a base thereof can be separated from one another, and houses a wafer cassette 7 that houses a predetermined number of, for example 25, semiconductor wafers W. As a result, the pod 3 isolates the semiconductor wafers W from the surrounding atmosphere. Moreover, in a state in which the pod 3 has been separated into the pod cover and the base, the wafer cassette 7 is mounted on the base.

The plasma processing apparatus 2 is comprised of at least one processing chamber (hereinafter referred to as a "P/C") 6 in which the semiconductor wafers W are subjected to the etching, at least one cassette chamber (hereinafter referred to as "C/C") 8 that receives the wafer cassettes 7, described below, from the SMIF 4, and a transfer chamber (hereinafter referred to as "T/C") 10 having therein a transfer arm 9 for transferring the semiconductor wafers W. In the plasma processing apparatus 2, the atmospheres inside each P/C 6, each C/C 8, and the T/C 10 are all made clean. Although only one P/C 6 and only one C/C 8 are shown in FIG. 1, the plasma processing apparatus 2 in the present embodiment is actually comprised of four P/C's 6, one T/C 10, and two C/C's 8.

Each P/C 6 is, for example, comprised of a processing chamber 11 formed in a cylindrical shape from a conductive material such as aluminum, an exhaust pipe 14 connected to a lower portion of the processing chamber 11, a susceptor 12 as a lower electrode that is disposed on a bottom surface in the processing chamber 11 and on which a semiconductor wafer W is mounted, a high-frequency power source 15 connected to the susceptor 12, a shower head 13 as an upper electrode that is disposed facing the susceptor 12 and formed in a flat hollow disk shape, a supply pipe 17 that is connected to the shower head 13, passes through the centre of an upper wall of the processing chamber 11, and communicates with an etching gas supply source 16, and a plurality of cylindrical permanent magnets (not shown) disposed at equal intervals in a circumferential direction around the whole of the circumference of the processing chamber 11.

The processing chamber 11 is constructed as a gastight structure, and is evacuated using a vacuum pump, not shown, via the exhaust pipe 14, thus forming a vacuum atmosphere of pressure, for example, not more than 1.33 Pa ($10^{-2}$ Torr) therein.

The susceptor 12 holds the semiconductor wafer W thereon through an attractive Coulomb force from an electrostatic chuck (not shown) or the like installed on an upper surface of the susceptor 12. Moreover, a focus ring 18 that focuses a plasma, described below, toward the semiconductor wafer W is disposed around the surface of the susceptor 12 on which the semiconductor wafer W is held. During the plasma processing, a 13.56 MHz high-frequency voltage is applied to the susceptor 12 from the high-frequency power source 15.

The shower head 13 is grounded, and is thus maintained at a ground potential during the plasma processing. Moreover, an etching gas supplied from the supply pipe 17 is jetted uniformly into the whole of the processing chamber 11 via the shower head 13.

In the P/C 6, when subjecting a semiconductor wafer W to etching, the semiconductor wafer W is mounted on the susceptor 12 in the processing chamber 11, the inside of the processing chamber 11 is evacuated, and the semiconductor wafer W is held on the susceptor 12 through the attractive Coulomb force from the electrostatic chuck. Next, the etching gas is supplied into the processing chamber 11 via the shower head 13 from the supply pipe 17, and the gas pressure of the etching gas is set to a degree of vacuum of, for example, not more than 1.33 Pa ($10^{-2}$ Torr).

After that, a 13.56 MHz high-frequency voltage is applied to the susceptor 12 from the high-frequency power source 15, thus bringing about a glow discharge between the susceptor 12 and the shower head 13 via the etching gas, and hence generating a plasma from the etching gas. At this time, electrons in the plasma preferentially flow into the susceptor 12 due to being much lighter than reactive ions or radicals (active species) in the plasma, whereby the susceptor 12 becomes negatively self-biased, and hence a potential difference arises between the self-bias potential of the susceptor 12 and the plasma potential, and thus an electric field is formed in the vertical direction between the plasma and the susceptor 12 due to this potential difference.

Furthermore, a horizontal magnetic field is applied to the inside of the processing chamber 11, that is generated by the cylindrical permanent magnets, the applied horizontal magnetic field being orthogonal to the electric field formed in the vertical direction so as to form an orthogonal electromagnetic field. Electrons in the plasma make cycloidal motion in the vicinity of the susceptor 12 through the action of this orthogonal electromagnetic field, thus further activating active species such as reactive ions in the plasma, and hence realizing generation of a plasma through a high-density magnetron. The generated plasma then etches the surface of the semiconductor wafer W.

Each C/C 8 has therein a receiving stage 19 that receives a wafer cassette 7 transferred onto the receiving stage 19 by a wafer cassette transfer arm 27, described below, in a SMIF 4. Moreover, the C/C 8 communicates with an enclosure 23, described below, of the SMIF 4, and is further connected to the T/C 10 via a gate valve 20. The gate valve 20 is a slide valve; when the gate valve 20 is open, the C/C 8 and the T/C 10 communicate with one another, and when the gate valve 20 is closed, the communication between the C/C 8 and the T/C 10 is blocked off.

The T/C 10 has therein the transfer arm 9, and an exhaust pipe 21 for reducing the pressure inside the T/C 10. The transfer arm 9 is a scalar type arm, and has a plurality of arm members, and a pick for holding a semiconductor wafer W. The transfer arm 9 removes unprocessed semiconductor wafers W from the wafer cassette 7 mounted on the receiving stage 19 and transfers these unprocessed semiconductor wafers W onto the susceptor 12, and recovers processed semiconductor wafers W from the susceptor 12 and houses these processed semiconductor wafers W in the wafer cassette 7. When the transfer arm 9 transfers a semiconductor wafer W in/out between the T/C 10 and the P/C 6, the pressure inside the T/C 10 is reduced down to the same level as in the processing chamber 11 using the exhaust pipe 21; when the transfer arm 9 transfers a semiconductor wafer W in/out between the T/C 10 and the C/C 8, the pressure inside the T/C 10 is kept substantially at atmospheric pressure.

The T/C 10 is connected to the P/C 6 via a gate valve 22. The gate valve 22 is a slide valve; when the gate valve 22 is open, the T/C 10 and the processing chamber 11 of the P/C 6 communicate with one another, and when the gate valve 22 is closed, the communication between the T/C 10 and the processing chamber 11 is blocked off.

Each SMIF 4 is comprised of an enclosure (sealed station unit) 23 which is a box-shaped sealed station unit that communicates with the C/C 8, a pod mounting portion (substrate removal/housing apparatus) 24 disposed in front of the enclosure 23, and a fan filter unit (not shown) that keeps the atmosphere in the enclosure 23 clean.

The pod mounting portion 24 has an upturned-open-box-shaped sliding cover 25 that slides upward in FIG. 1, and a pod stage (mounting stage) 26 on which a pod 3 is mounted. The enclosure 23 has therein a wafer cassette transfer arm (substrate transferring apparatus) 27 for transferring a wafer cassette 7. The wafer cassette transfer arm 27 is a gantry arm, and has in a lower portion thereof a mounting portion on which the wafer cassette 7 is mounted. The wafer cassette transfer arm 27 can make pendulum-like motion about a fulcrum provided in an upper portion of the wafer cassette transfer arm 27, and moreover the wafer cassette transfer arm 27 is freely movable relative to the enclosure 23 in the vertical direction in FIG. 1. Due to the pendulum-like motion and vertical movement of the wafer cassette transfer arm 27, a wafer cassette 7 can thus be smoothly moved between the pod mounting portion 24 and the C/C 8 via the enclosure 23.

According to the SMIF 4, when removing semiconductor wafers W from a pod 3, the sliding cover 25 is slid upward so as to lift up the pod cover from the base of the pod 3, so that the pod cover is separated away from the base of the pod 3. At this time, the wafer cassette 7 is kept on the pod stage 26 together with the base of the pod 3. Moreover, when housing semiconductor wafers W in a pod 3, the sliding cover 25 having the separated pod cover mounted thereon is slid downward, thus covering the base and the wafer cassette 7 mounted on the pod stage 26 with the pod cover.

Although only one SMIF 4 is shown in FIG. 1, the plasma processing system 1 actually has two SMIF's 4, the two SMIF's 4 being disposed respectively in correspondence with the two C/C's 8.

Each preliminary loader 5 is comprised of a stage-shaped unprocessed pod port (first sealed container storage portion) 28 that has mounted thereon and thus stores an unprocessed pod 3, a shelf-like processed pod port (second sealed container storage portion) 29 that has mounted thereon and thus stores a processed pod 3, and a plate-shaped pod moving mechanism 30 that is provided upright on a side surface of the preliminary loader 5 and extends as far as an upper space of the pod mounting portion 24 in the SMIF 4.

The pod moving mechanism 30 has a pod arm (sealed container moving apparatus) 31 that holds a pod 3, and guiding grooves 31A for guiding the pod arm 31 to a pod 3 mounted on the unprocessed pod port 28, the processed pod port 29 or the pod stage 26 of the pod mounting portion 24. The pod arm 31 moves unprocessed pods 3 along the guiding grooves 31A from the unprocessed pod port 28 to the pod stage 26, and moves processed pods 3 along the guiding grooves 31A from the pod stage 26 to the processed pod port 29.

The unprocessed pod port 28 and the processed pod port 29 are exposed to the working environment in which a worker works, e.g. the atmosphere in a clean room, and hence the worker can take unprocessed pods 3 out from a stocker (not shown) and store these unprocessed pods 3 on the unprocessed pod port 28 at desired times, and moreover can recover processed pods 3 stored on the processed pod port 29 at desired times.

Although only one preliminary loader 5 is shown in FIG. 1, the plasma processing system 1 actually has two preliminary loaders 5, the two preliminary loaders 5 being disposed respectively in correspondence with the two SMIF's 4.

Moreover, the plasma processing system 1 has a system controller, described below with reference to FIG. 4, that controls the plasma processing apparatus 2, the SMIF's 4 and the preliminary loaders 5.

Next, a plasma processing method which is a substrate processing method according to the present embodiment will be described.

FIGS. 2A to 2F are views useful in explaining the plasma processing method which is the substrate processing method according to the present embodiment, and show respective operations in the plasma processing method.

First, a worker mounts an unprocessed pod 3 having a wafer cassette 7 therein on the unprocessed pod port 28 (see FIG. 2A), and then the pod arm 31 moves the mounted pod 3 to the pod stage 26 and mounts the pod 3 on the pod stage 26 (sealed container moving step) (see FIG. 2B). After that, the worker mounts another unprocessed pod 3 on the unprocessed pod port 28 at a desired time (see FIG. 2C). This other mounted unprocessed pod 3 is stored on the unprocessed pod port 28 (first sealed container storage step) until the pod 3 mounted on the pod stage 26 has been removed from the pod stage 26.

Next, the sliding cover 25 of the pod mounting portion 24 is slid upward so as to separate the unprocessed pod 3 mounted on the pod stage 26 into the pod cover and the base thereof (substrate removal step) (see FIG. 2D). At this time, the space formed between the sliding cover 25 and the pod stage 26 is made clean using the fan filter unit, and hence the base and the wafer cassette 7 are mounted on the pod stage 26 in a clean atmosphere.

Next, the wafer cassette transfer arm 27 transfers the wafer cassette 7 onto the receiving stage 19 in the C/C 8 (substrate transferring in step) (see FIGS. 2D and 2E), and then the transfer arm 9 removes the unprocessed semiconductor wafers W from the wafer cassette 7 one at a time, and transfers each semiconductor wafer W into the processing chamber 11 of the P/C 6, where the semiconductor wafer W is subjected to etching (substrate processing step). After the semiconductor wafer W has been subjected to the etching, the transfer arm 9 recovers the semiconductor wafer W from the processing chamber 11 and stores the semiconductor wafer W back in the wafer cassette 7. The transferring in and out of semiconductor wafers W by the transfer arm 9 and the etching of these semiconductor wafers W in the P/C 6 is repeated for all of the semiconductor wafers W housed in the wafer cassette 7.

After all of the semiconductor wafer W housed in the wafer cassette 7 mounted on the receiving stage 19 have been subjected to the etching, the wafer cassette transfer arm 27 transfers the wafer cassette 7 to the pod stage 26 and mounts the wafer cassette 7 on the base of the pod 3 on the pod stage 26 (substrate transferring out step) (see FIGS. 2E and 2D, i.e. reverse of operation from FIG. 2D to FIG. 2E). The sliding cover 25 having the separated pod cover mounted thereon is then slid downward, thus covering the base and the wafer cassette 7 mounted on the base with the pod cover (substrate housing step) (see FIG. 2C, i.e. reverse of operation from FIG. 2C to FIG. 2D). As a result, the wafer cassette 7 is sealed in the pod 3.

Next, the pod arm 31 removes the processed pod 3 from the pod stage 26, and moves the processed pod 3 to the processed pod port 29 and mounts the processed pod 3 on the processed pod port 29 (see FIG. 2F). The mounted processed pod 3 is then stored on the processed pod port 29 (second sealed container storage step) until being recovered by the worker at a desired time.

Next, the other unprocessed pod 3 that has been stored on the unprocessed pod port 28 is moved to and mounted on the pod stage 26 by the pod arm 31 (see FIGS. 2A and 2B). After that, the worker mounts yet another unprocessed pod 3 on the unprocessed pod port 28 (see FIG. 2C).

According to the substrate processing system, the sealed container storing apparatus and the substrate processing method of the present embodiment, the semiconductor wafers W are housed in pods 3. After unprocessed semiconductor wafers W have been removed from an unprocessed pod 3 mounted on the pod stage 26 of the SMIF 4, the semiconductor wafers W are transferred into a cleaned atmosphere and subjected to plasma processing. Furthermore, another unprocessed pod 3 that has been mounted on the unprocessed pod port 28 by a worker at a desired time is stored on the unprocessed pod port 28, and after the plasma processing, the processed pod 3 is removed from the pod stage 26 and stored on the processed pod port 29, and then the other unprocessed pod 3 stored on the unprocessed pod port 28 is moved onto the pod stage 26. As a result, while the semiconductor wafers W removed from the unprocessed pod 3 mounted on the pod stage 26 of the SMIF 4 are being subjected to the plasma processing, the worker can store the other unprocessed pod 3 on the unprocessed pod port 28, and moreover the worker can recover a processed pod 3 stored on the processed pod port 29. Consequently, dust can be prevented from becoming attached to the semiconductor wafers W without increasing the degree of cleanliness of the working environment in which the plasma processing system is placed, for example a clean room, to a predetermined level, and the plasma processing throughput can be increased without increasing the burden on the worker.

Next, an inter-apparatus communication system of the plasma processing system 1 will be described.

Figure 3:
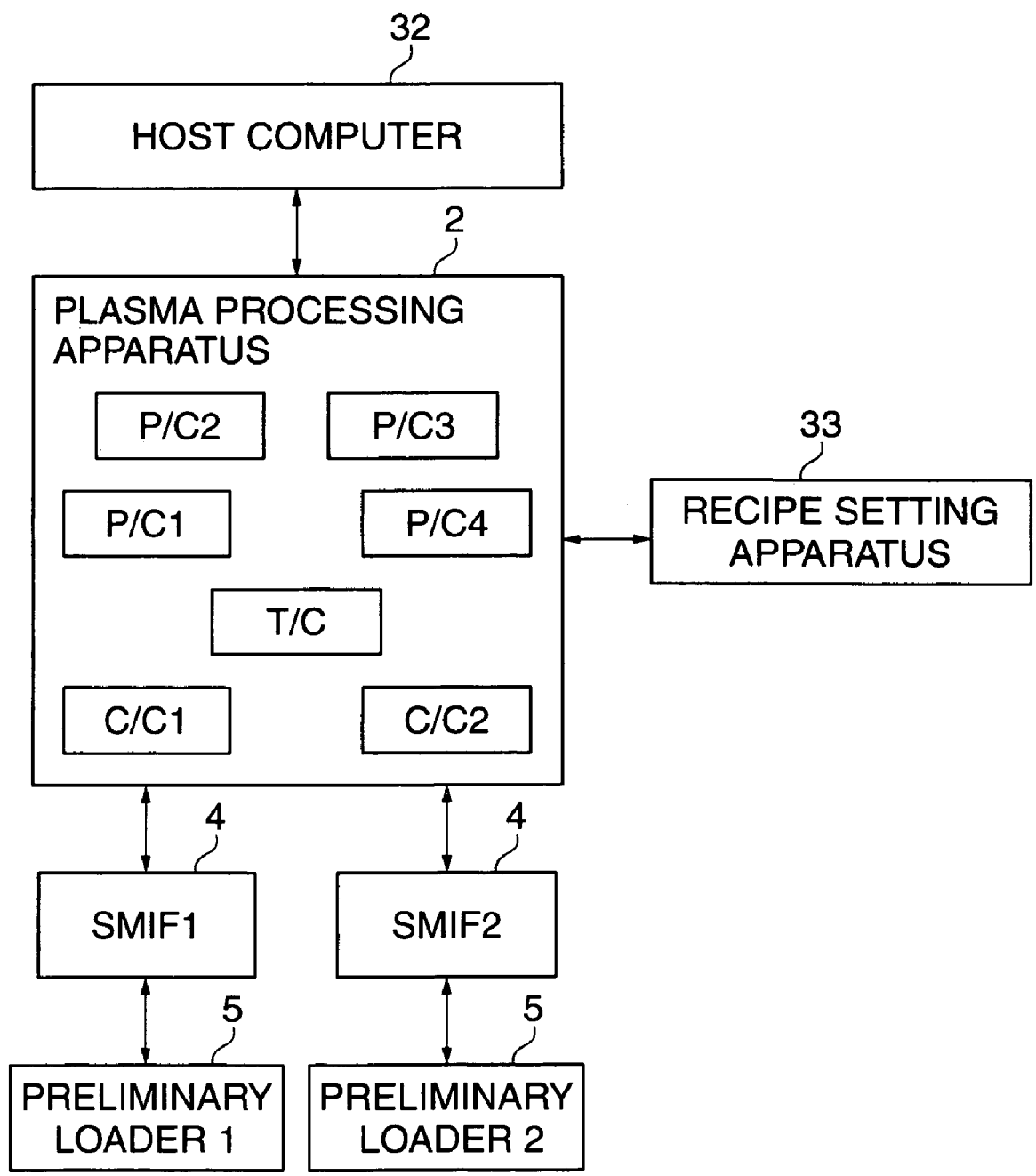
FIG. 3 is a diagram showing an inter-apparatus communication system of the plasma processing system.

FIG. 3 is a diagram showing the inter-apparatus communication system of the plasma processing system.

As shown in FIG. 3, in the plasma processing system 1, each preliminary loader 5 and the corresponding SMIF 4, and each SMIF 4 and the plasma processing apparatus 2 are communicably connected together by a communication cable or the like, and furthermore each of a host computer (controller) 32 and a recipe setting apparatus (processing contents setting apparatus) 33 is communicably connected to the plasma processing apparatus 2 by a communication cable or the like.

The recipe setting apparatus 33 has a display panel (not shown) that displays a recipe input GUI (graphical user interface) 34 as shown in FIG. 5. The recipe input GUI 34 has a processing lot input section 35 using which an etching recipe for a current processing lot can be inputted, and a reservation lot input section 36 using which an etching recipe for a subsequent processing lot can be inputted. Using the recipe input GUI 34, a worker sets etching recipes to be implemented in the P/C's 6.

The host computer 32 controls the operation of the plasma processing apparatus 2 based on the recipes set through the recipe input GUI 34 of the recipe setting apparatus 33. The host computer 32 also controls the operations of the SMIF's 4 and the preliminary loaders 5 through communication via the plasma processing apparatus 2.

According to the plasma processing system 1, the host computer 32 controls the operation of the plasma processing apparatus 2, and moreover controls the operations of the SMIF's 4 and the preliminary loaders 5 through communication via the plasma processing apparatus 2. As a result, there is no need to place communication cables or the like for communicably connecting other communication equipment, for example the host computer 32 to each of the SMIF's 4 and the preliminary loaders 5 directly. Moreover, when carrying out installation, modification, or maintenance of the plasma processing system 1, there is no need to change settings of another computer, for example a computer that controls the whole of a manufacturing plant in which the plasma processing system 1 is installed (e.g. a PC 88 shown in FIG. 4, described below), and hence installation and modification costs for the plasma processing system 1 can be reduced, and maintenance of the plasma processing system 1 can be carried out easily.

Besides the host computer 32, the operations of the component elements of the plasma processing system 1 are also controlled by the previously mentioned system controller.

Figure 4:
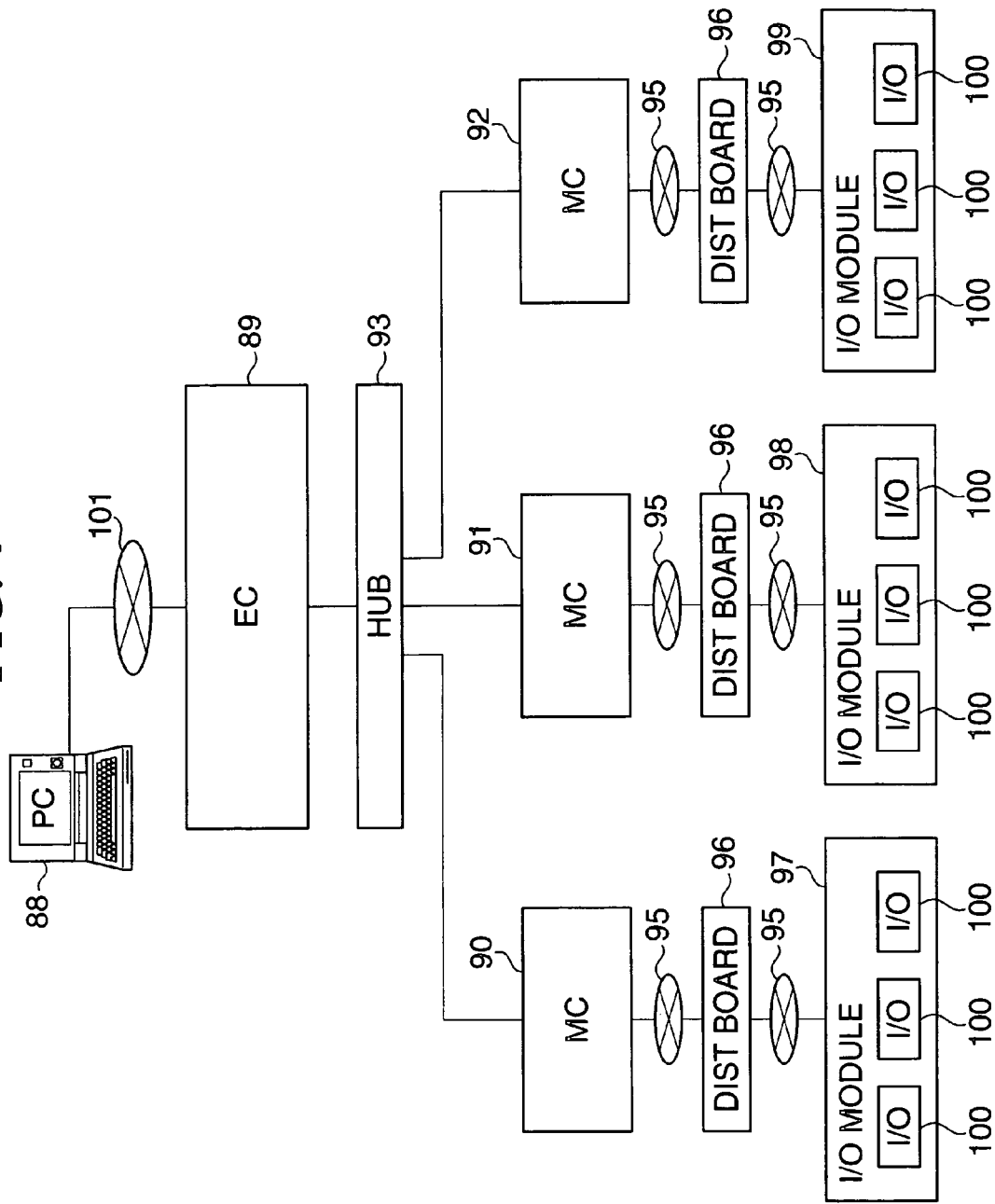
FIG. 4 is a diagram useful in explaining the schematic construction of a system controller of the plasma processing system.

FIG. 4 is a diagram useful in explaining the system controller of the plasma processing system 1.

As shown in FIG. 4, the system controller is comprised of an EC (equipment controller) 89, a plurality of, for example three, MC's (module controllers) 90, 91 and 92, and a switching hub 93 that connects the EC 89 to each of the MC's. In the system controller, the EC 89 is connected via a LAN (local area network) 101 to the PC 88, which is an MES (manufacturing execution system) that carries out overall control of the manufacturing processes in the manufacturing plant in which the plasma processing system 1 is installed. In collaboration with the system controller, the MES feeds back real-time data on the processes in the manufacturing plant to a basic work system (not shown), and makes decisions relating to the processes in view of the overall load on the manufacturing plant and so on.

The EC 89 is a central controller that controls the MC's and carries out overall control of the operation of the plasma processing system 1. The EC 89 has a CPU, a RAM, an HDD and so on. The CPU of the EC 89 sends control signals to the MC's in accordance with programs corresponding to wafer processing method menu items, i.e. recipes, specified by a user using the recipe setting apparatus 33, thus controlling the operations of the plasma processing apparatus 2, the SMIF's 4 and the preliminary loaders 5.

The switching hub 93 switches which MC is connected to the EC 89 in accordance with the control signals from the EC 89.

The MC's 90, 91 and 92 are controllers that control the operations of the P/C's 6, the C/C's 8 and the T/C 10 of the plasma processing apparatus 2, and the SMIF's 4 and the preliminary loaders 5. Each MC has a CPU, a RAM, an HDD and so on, and sends control signals to end devices, described below. It is to be understood that although only three MC's are shown in FIG. 4, to control the P/C's 6, the C/C's 8, the SMIF's 4 and the T/C 10, the system controller of the plasma processing system 1 shown in FIG. 1 must actually have a number of MC's corresponding to the total number of the P/C's 6, the C/C's 8, the SMIF's 4 and the T/C 10. Each preliminary loader 5 is connected to the corresponding SMIF 4 via a hub (not shown), and hence is controlled by the MC that controls that SMIF 4.

Each MC is respectively connected to an I/O (input/output) module 97, 98 or 99 through a DIST (distribution) board 96 via a GHOST network 95. Each GHOST network 95 is implemented by an LSI known as a GHOST (general high-speed optimum scalable transceiver) on an MC board of the corresponding MC. Although only one I/O module is connected to each GHOST network 95 in FIG. 4, a maximum of 31 I/O modules can be connected to each GHOST network 95; with respect to the GHOST network 95, the MC is the master, and the I/O modules are slaves.

The I/O module 97 is comprised of a plurality of I/O units 100 that are connected to component elements (hereinafter referred to as "end devices") of one P/C 6, and transmits control signals to the end devices and output signals from the end devices. Examples of the end devices connected to the I/O units 100 of the I/O module 97 are component elements of the etching gas supply source 16 of the P/C 6.

Each of the I/O modules 98 and 99 has a similar construction to the I/O module 97. Moreover, the connections between the MC's 91 and 92, which correspond to two sets of the C/C's 8, T/C 10 and SMIF's 4, and the I/O modules 98 and 99 respectively are similar to the connection between the MC 90 and the I/O module 97 described above, and hence description thereof is omitted.

Each GHOST network 95 is also connected to an I/O board (not shown) that controls input/output of digital signals, analog signals and serial signals to/from the I/O units 100.

According to the plasma processing system 1, when implementing plasma processing, the CPU of the EC 89 implements the plasma processing by sending control signals to desired end devices via the switching hub 93, the MC's 90, 91 and 92, the GHOST networks 95, and the I/O units 100 of the I/O modules 97, 98 and 99, in accordance with a program corresponding to the processing.

Specifically, the CPU controls the plasma processing system 1 as described above by sending control signals to the end devices of the P/C's 6, the C/C's 8, the T/C 10 and the SMIF's 4.

According to the system controller shown in FIG. 4, the end devices are not directly connected to the EC 89, but rather I/O modules each having modularized therein I/O units 100 each connected to an end device are formed, and each I/O module is connected to the EC 89 via an MC and the switching hub 93. As a result, the communication system can be simplified.

Moreover, each of the control signals sent by the CPU of the EC 89 contains the address of the I/O unit 100 connected to the end device that is to be the destination of the control signal, and the address of the I/O module containing that I/O unit 100. The switching hub 93 refers to the address of the I/O module in the control signal, and then the GHOST of the appropriate MC refers to the address of the I/O unit 100 in the control signal, whereby the need for the switching hub 93 or the MC to ask the CPU for the destination of the control signal can be eliminated, and hence smoother transmission of the control signals can be realized.

Next, a sequence of operation and communication performed by the plasma processing system 1 will be described.

Figure 6B:
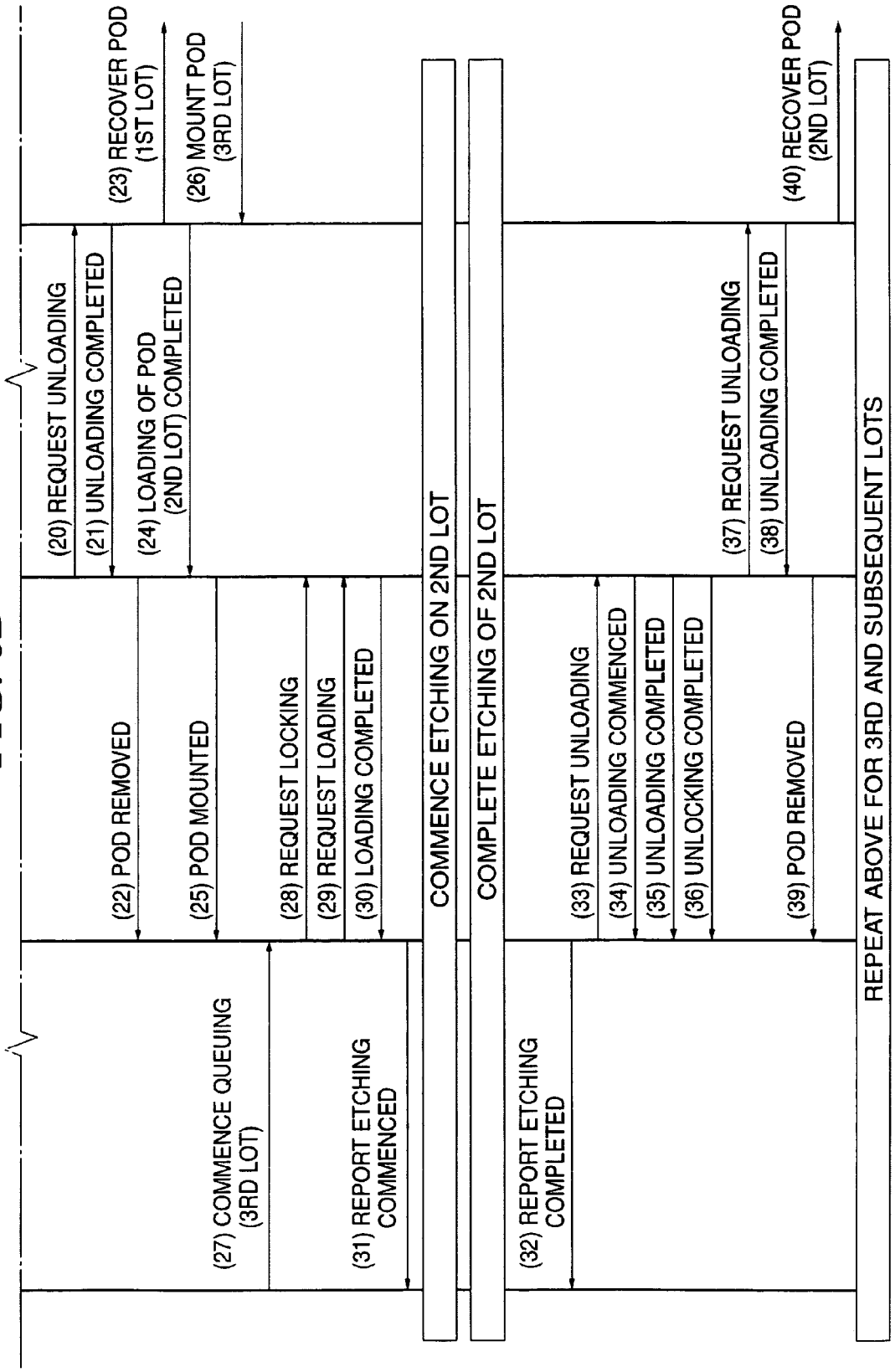

FIGS. 6A and 6B are diagrams showing the operation and communication sequence for the plasma processing system 1.

As shown in FIGS. 6A and 6B, upon a worker starting up the plasma processing system 1, the plasma processing apparatus 2 asks the host computer 32 for an etching recipe for a first lot (hereinafter referred to as the "first lot recipe") (1), whereupon the host computer 32 replies to the plasma processing apparatus 2 with a recipe that has been set in the processing lot input section 35 of the recipe setting apparatus 33 (2).

The worker then mounts a first lot unprocessed pod 3 on the unprocessed pod port 28 of a preliminary loader 5 (3), and the pod arm 31 moves the mounted pod 3 onto the pod stage 26 of the corresponding SMIF 4, after which the preliminary loader 5 communicates to the SMIF 4 that the moving (loading) of the pod 3 has been completed (4). Upon receiving this communication, the SMIF 4 communicates to the plasma processing apparatus 2 that the pod 3 has been mounted on the pod stage 26 (5). Here, in the communications from communication (5) onward, if the first lot recipe is cancelable, then because the first lot recipe has already been sent to the plasma processing apparatus 2 in communication (2), even if the first lot recipe is deleted from the processing lot input section 35 of the recipe input GUI 34, the first lot recipe will remain in the plasma processing apparatus 2, and hence conflict may arise in the plasma processing apparatus 2. According to the plasma processing system 1, in the communications from communication (5) onward, the host computer 32 thus carries out control such that it becomes impossible to cancel the first lot recipe using the recipe setting apparatus 33 via the plasma processing apparatus 2. Specifically, the host computer 32 carries out control such that it becomes impossible to input a new recipe or delete the set recipe in the processing lot input section 35.

Next, after the first lot unprocessed pod 3 has been moved from the unprocessed pod port 28, the worker mounts a second lot unprocessed pod 3 on the unprocessed pod port 28 (6). The mounted second lot unprocessed pod 3 is stored on the unprocessed pod port 28 until there is a communication (21) from the SMIF 4 to the preliminary loader 5 that removal (unloading) of the first lot processed pod 3, described below, from the pod stage 26 has been completed.

Next, the host computer 32 communicates to the plasma processing apparatus 2 to commence reservation (queuing) by enabling input of a second lot etching recipe (hereinafter referred to as the "second lot recipe") using the recipe setting apparatus 33 (7). Upon receiving this communication, the plasma processing apparatus 2 enables input of the second lot recipe using the reservation lot input section 36 of the recipe input GUI 34.

The plasma processing apparatus 2 then sends to the SMIF 4 a request to lock the first lot unprocessed pod 3 on the pod stage 26 (8), and also a request to load the wafer cassette 7 into the C/C 8 (9). Upon receiving these requests, the SMIF 4 removes the wafer cassette 7 from the first lot unprocessed pod 3, and loads the wafer cassette 7 into the C/C 8. Once the loading of the wafer cassette 7 into the C/C 8 has been completed, the SMIF 4 then communicates this to the plasma processing apparatus 2 (10). Upon receiving this communication, the plasma processing apparatus 2 commences etching on the first lot, and reports this to the host computer 32 (11).

Next, the plasma processing apparatus 2 asks the host computer 32 for the second lot recipe (12), whereupon the host computer 32 replies to the plasma processing apparatus 2 with a recipe that has been set in the reservation lot input section 36 (13)

After that, once the etching of the first lot has been completed, the plasma processing apparatus 2 reports this to the host computer 32 (15), and furthermore sends a request to the SMIF 4 for the wafer cassette 7 to be unloaded from the C/C 8 (16). Upon receiving this request, the SMIF 4 commences unloading of the wafer cassette 7 from the C/C 8 onto the pod stage 26; first, the SMIF 4 communicates to the plasma processing apparatus 2 that this unloading is to be carried out (17), and then when this unloading has been completed, and moreover unlocking of the pod 3 from the pod stage 26 has been completed, the SMIF 4 communicates this to the plasma processing apparatus 2 (18, 19).

Next, the SMIF 4 sends a request to the preliminary loader 5 to unload (move) the first lot processed pod 3 mounted on the pod stage 26 onto the processed pod port 29 (20), and the preliminary loader 5 unloads the first lot processed pod 3 onto the processed pod port 29 by the pod arm 31. Once this unloading has been completed by the pod arm 31, the SMIF 4 detects this and then communicates the detection result to each of the preliminary loader 5 and the plasma processing apparatus 2 (21, 22). The worker then recovers the first lot processed pod 3 mounted and stored on the processed pod port 29 (23).

After that, the pod arm 31 moves the second lot unprocessed pod 3 stored on the unprocessed pod port 28 onto the pod stage 26, after which the preliminary loader 5 communicates to the SMIF 4 that the moving (loading) of the pod 3 has been completed (24). Upon receiving this communication, the SMIF 4 communicates to the plasma processing apparatus 2 that the pod 3 has been mounted on the pod stage 26 (25). Here, in the communications from communication (25) onward, the host computer 32 carries out control such that it becomes impossible to cancel the second lot recipe using the recipe setting apparatus 33 via the plasma processing apparatus 2.

Next, after the second lot unprocessed pod 3 has been moved from the unprocessed pod port 28, the worker mounts a third lot unprocessed pod 3 on the unprocessed pod port 28 (26). The mounted third lot unprocessed pod 3 is stored on the unprocessed pod port 28 until there is a communication (38) from the SMIF 4 to the preliminary loader 5 that unloading of the second lot processed pod 3, described below, from the pod stage 26 has been completed.

Next, the host computer 32 communicates to the plasma processing apparatus 2 to commence queuing by enabling input of a third lot etching recipe using the recipe setting apparatus 33 (27). Upon receiving this communication, the plasma processing apparatus 2 enables input of the third lot etching recipe using the reservation lot input section 36 of the recipe input GUI 34.

The plasma processing apparatus 2 then sends to the SMIF 4 a request to lock the second lot unprocessed pod 3 on the pod stage 26 (28), and also a request to load the wafer cassette 7 into the C/C 8 (29). Upon receiving these requests, the SMIF 4 removes the wafer cassette 7 from the second lot unprocessed pod 3, and loads the wafer cassette 7 into the C/C 8. Once the loading of the wafer cassette 7 into the C/C 8 has been completed, the SMIF 4 then communicates this to the plasma processing apparatus 2 (30). Upon receiving this communication, the plasma processing apparatus 2 commences etching on the second lot, and reports this to the host computer 32 (31).

Next, the plasma processing apparatus 2 asks the host computer 32 for the third lot etching recipe, whereupon the host computer 32 replies to the plasma processing apparatus 2 with the third lot etching recipe set in the reservation lot input section 36.

After that, once the etching of the second lot has been completed, the plasma processing apparatus 2 reports this to the host computer 32 (32), and furthermore sends a request to the SMIF 4 for the wafer cassette 7 to be unloaded from the C/C 8 (33). Upon receiving this request, the SMIF 4 commences unloading of the wafer cassette 7 from the C/C 8 onto the pod stage 26; first, the SMIF 4 communicates to the plasma processing apparatus 2 that this unloading is to be carried out (34), and then when this unloading has been completed, and moreover unlocking of the pod 3 from the pod stage 26 has been completed, the SMIF 4 communicates this to the plasma processing apparatus 2 (35, 36).

Next, the SMIF 4 sends a request to the preliminary loader 5 to unload the second lot processed pod 3 mounted on the pod stage 26 onto the processed pod port 29 (37), and the preliminary loader 5 unloads the second lot processed pod 3 onto the processed pod port 29 by the pod arm 31. Once this unloading has been completed by the pod arm 31, the SMIF 4 detects this and then communicates the detection result to each of the preliminary loader 5 and the plasma processing apparatus 2 (38, 39). The worker then recovers the second lot processed pod 3 mounted and stored on the processed pod port 29 (40).

The operations and communications described above are then repeated for the third and subsequent lots.

According to the operation and communication sequence shown in FIGS. 6A and 6B described above, after the preliminary loader 5 has moved a pod 3 from the unprocessed pod port 28 onto the pod stage 26 and communicated that this moving has been completed to the plasma processing apparatus 2 via the SMIF 4 (steps 4 and 5, or steps 24 and 25), the host computer 32 causes the plasma processing apparatus 2 to enable input of a recipe for etching of the next lot (hereinafter referred to as the "next lot recipe") using the reservation lot input section 36 of the recipe setting apparatus 33. As a result, a worker can set the next lot recipe at a desired time.

Figure 7:
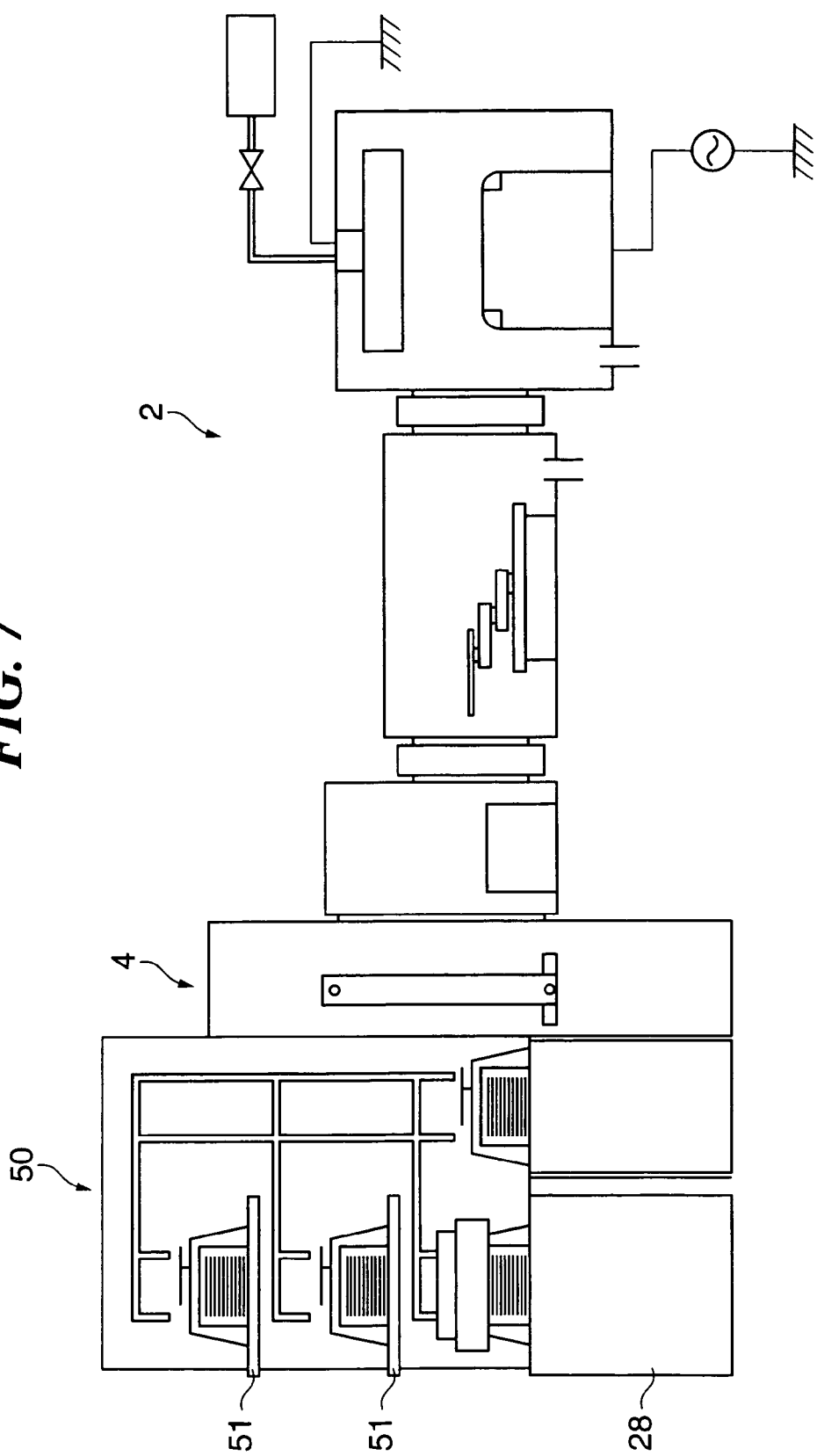
FIG. 7 is a view schematically showing the construction of a variation of the plasma processing system

In the embodiment described above, each preliminary loader 5 has one unprocessed pod port 28 and one processed pod port 29. However, there are no limitations on the numbers of unprocessed pod ports and processed pod ports. For example, as shown in FIG. 7, a preliminary loader 50 may have two processed pod ports 51 and one unprocessed pod port 28. As a result, the degree of freedom for choosing the time of recovering a processed pod 3 by a worker can be increased. Moreover, a preliminary loader may have a plurality of unprocessed pod ports. As a result, the degree of freedom for choosing the time of mounting an unprocessed pod 3 by a worker can be increased.

Figure 8:
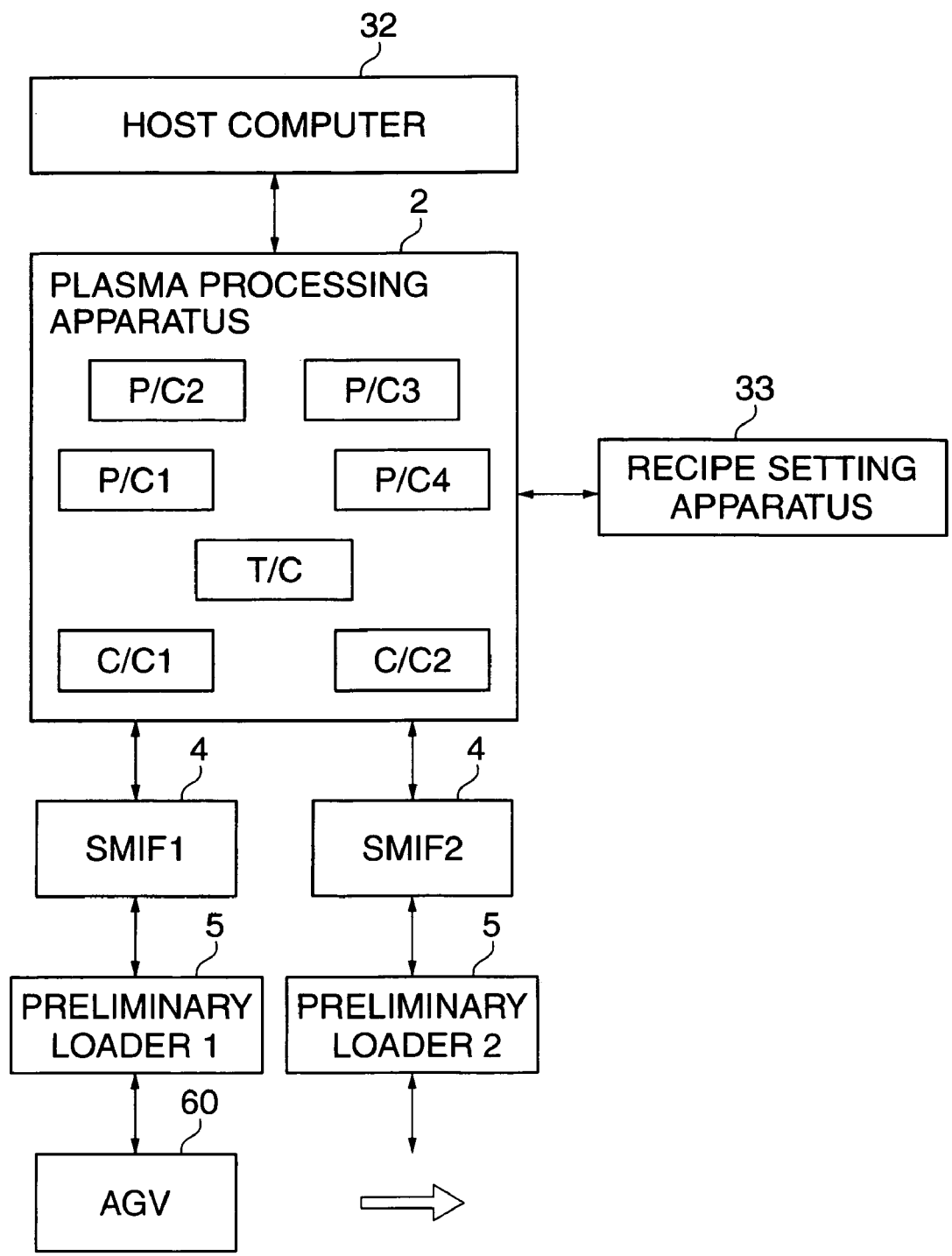
FIG. 8 is a diagram showing a variation of the inter-apparatus communication system.
Figure 9C:
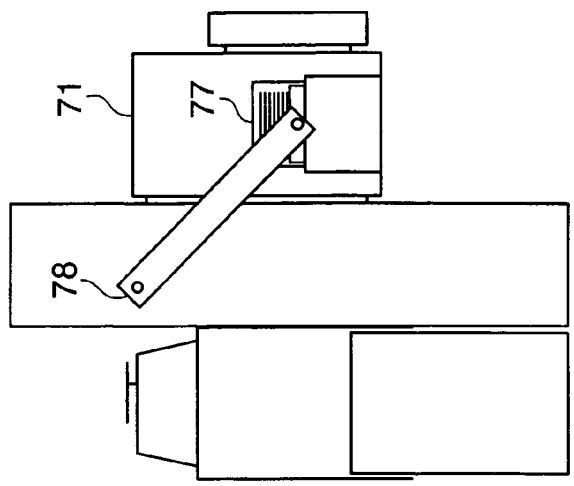
FIGS. 9A to 9C are views schematically showing the construction of a SMIF used with a conventional substrate processing system; specifically.
Figure 9B:
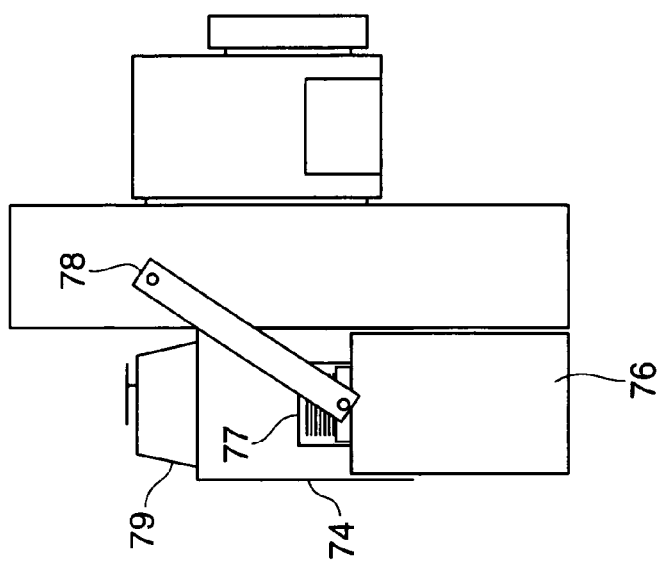
Figure 9A:
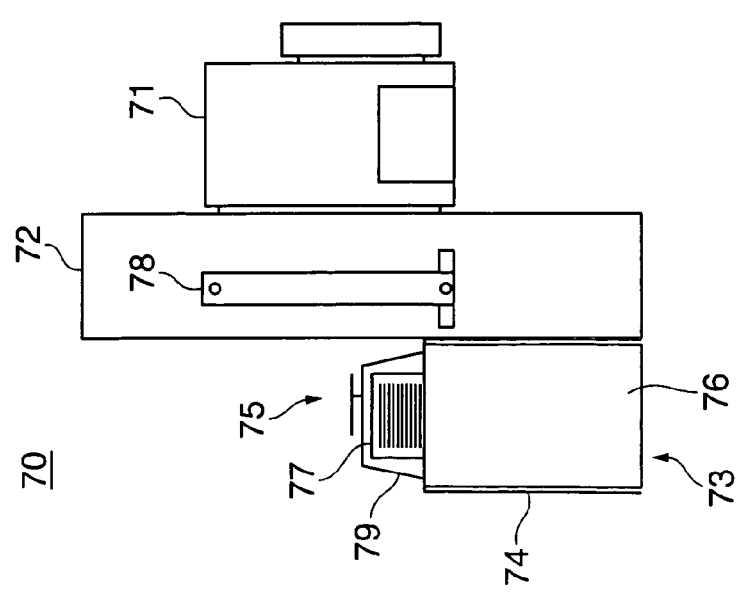

Moreover, in the embodiment described above, the plasma processing system 1 is comprised of a plasma processing apparatus 2, SMIF's 4, preliminary loaders 5, a host computer 32, and a recipe setting apparatus 33. However, the apparatuses from which the plasma processing system is constructed are not limited thereto. For example, as shown in FIG. 8, the plasma processing system may further have an AGV (automated guided vehicle) 60 which is an autonomously controlled transfer robot that transfers pods 3. As a result, the burden on a worker can be further reduced. Moreover, according to such a plasma processing system, the operation of the AGV 60 is controlled by the host computer 32; the AGV 60 is communicably connected to a preliminary loader 5 through optical communication, and hence can communicate with the host computer 32 through the preliminary loader 5, the corresponding SMIF 4, and the plasma processing apparatus 2. There is thus no need for other communication equipment for communicating with the host computer 32, for example there is no need to place communication cables or the like.

In the embodiment described above, the semiconductor wafers W are subjected to etching. However, the plasma processing to which the semiconductor wafers W are subjected is not limited thereto, but rather may be, for example, film formation processing such as metal CVD processing.

Moreover, in the embodiment described above, the substrates to be processed are semiconductor wafers. However, the substrates to be processed are not limited thereto, but rather may be, for example, LCD (liquid crystal display) or FPD (flat panel display) glass substrates.

Moreover, it is to be understood that the object of the present invention can also be attained by supplying to a computer, for example the host computer 32 or the EC 89, a storage medium storing program code of software that realizes the functions of the embodiment described above, and then causing a CPU of the computer to read out and execute the program code stored in the storage medium.

In this case, the program code itself read out from the storage medium realizes the functions of the embodiment, and hence the program code and the storage medium storing the program code constitute the present invention.

The storage medium for supplying the program code may be any storage medium capable of storing the program code, for example a RAM, an NV-RAM, a floppy (registered trademark) disk, a hard disk, an optical disk, such as a CD-ROM, a CD-R, a CD-RW, a DVD (a DVD-ROM, a DVD-RAM, a DVD-RW, or a DVD+RW), a magnetic-optical disk, a magnetic tape, a nonvolatile memory card, or a ROM. Alternatively, the program code may be supplied to the computer by being downloaded from another computer, database or the like, not shown in the drawings, connected to an internet, a commercial network, a local area network or the like.

Moreover, it is to be understood that the functions of the embodiment described above can be realized not only by executing a program code read out by a computer, but also by causing an OS (operating system) or the like which operates on the computer to perform a part or all of the actual operations based on instructions of the program code.

Furthermore, it is to be understood that the functions of the above described embodiment can also be realized by writing the program code read out from the storage medium into a memory provided on an expansion board inserted into the computer or in an expansion unit connected to the computer, and then causing a CPU or the like provided on the expansion board or in the expansion unit to perform part or all of the actual processing based on instructions of the program code.

The form of the program may be an object code, a program code executed by an interpreter, or script data supplied to an OS (Operating System).

What is claimed is:

1. A substrate processing system comprising:
a substrate processing apparatus that subjects substrates to plasma processing in a cleaned atmosphere;
a substrate transferring in/out apparatus having a sealed station unit that is connected to said substrate processing apparatus and has a cleaned atmosphere therein, a mounting stage on which a sealed container housing substrates is mounted, a substrate removal/housing apparatus that carries out removal of substrates from the sealed container and housing of substrates into the sealed container, and a substrate transferring apparatus that transfers substrates between said mounting stage and said substrate processing apparatus via said sealed station unit; and
a sealed container storing apparatus having a first sealed container storage portion that stores a sealed container housing substrates that have not been subjected to the plasma processing, a second sealed container storage portion that stores a sealed container housing substrates that have been subjected to the plasma processing, and a sealed container moving apparatus that moves the sealed containers between said first sealed container storage portion and said mounting stage, and between said mounting stage and said second sealed container storage portion.

2. A substrate processing system as claimed in claim 1, further comprising a processing contents setting apparatus that is connected to said substrate processing apparatus, for setting processing contents for the plasma processing, and a controller that is connected to said substrate processing apparatus, for controlling operation of said substrate processing apparatus based on the processing contents set by said processing contents setting apparatus, and for controlling operations of said substrate transferring in/out apparatus and said sealed container storing apparatus through communication via said substrate processing apparatus.

3. A substrate processing system as claimed in claim 2, wherein said sealed container storing apparatus and said substrate transferring in/out apparatus are communicably connected together, said substrate transferring in/out apparatus and said substrate processing apparatus are communicably connected together, and wherein said controller is in responsive to said sealed container storing apparatus informing said substrate processing apparatus via said substrate transferring in/out apparatus that a sealed container has been moved from said first sealed container storage portion onto said mounting stage, for causing said substrate processing apparatus to enable setting of processing contents for plasma processing to be carried out on substrates housed in another sealed container using said processing contents setting apparatus.

4. A sealed container storing apparatus for a substrate processing system that comprises a substrate processing apparatus that subjects substrates to plasma processing in a cleaned atmosphere, and a substrate transferring in/out apparatus having a sealed station unit that is connected to the substrate processing apparatus and has a cleaned atmosphere therein, a mounting stage on which a sealed container housing substrates is mounted, a substrate removal/housing apparatus that carries out removal of substrates from the sealed container and housing of substrates into the sealed container, and a substrate transferring apparatus that transfers substrates between the mounting stage and the substrate processing apparatus via the sealed station unit, the sealed container storing apparatus being connected to the substrate transferring in/out apparatus, the sealed container storing apparatus comprising:

a first sealed container storage portion that stores a sealed container housing substrates that have not been subjected to the plasma processing;

a second sealed container storage portion that stores a sealed container housing substrates that have been subjected to the plasma processing; and a sealed container moving apparatus that moves the sealed containers between said first sealed container storage portion and the mounting stage, and between the mounting stage and said second sealed container storage portion.

* * * * *